US009076626B2

(12) United States Patent
Ribton et al.

(10) Patent No.: US 9,076,626 B2
(45) Date of Patent: Jul. 7, 2015

(54) PLASMA SOURCE APPARATUS AND METHODS FOR GENERATING CHARGED PARTICLE BEAMS

(71) Applicant: The Welding Institute, Cambridgeshire (GB)

(72) Inventors: Colin Ribton, Cambridgeshire (GB); Allan Sanderson, Cambridgeshire (GB)

(73) Assignee: THE WELDING INSTITUTE, Cambridgeshire (GB)

( * ) Notice: Subject to any disclaimer, the term of this patent is extended or adjusted under 35 U.S.C. 154(b) by 0 days.

(21) Appl. No.: 14/406,012

(22) PCT Filed: May 20, 2013

(86) PCT No.: PCT/GB2013/051296
§ 371 (c)(1),
(2) Date: Dec. 5, 2014

(87) PCT Pub. No.: WO2013/186523
PCT Pub. Date: Dec. 19, 2013

(65) Prior Publication Data
US 2015/0144808 A1    May 28, 2015

(30) Foreign Application Priority Data

Jun. 14, 2012    (GB) .................................. 1210607.6

(51) Int. Cl.
*H05H 1/00*    (2006.01)
*H01J 49/10*    (2006.01)
(Continued)

(52) U.S. Cl.
CPC ........... *H01J 37/077* (2013.01); *H01J 37/3002* (2013.01);
(Continued)

(58) Field of Classification Search
CPC .............. H01J 37/321; H01J 37/32174; H01J 37/32082; H01J 37/077; H01J 37/32009; H01J 37/32091; H05H 1/46; H05H 1/24
USPC ............ 250/423 R, 424; 315/111.21, 111.31, 315/111.61, 111.81; 313/231.31
See application file for complete search history.

(56) References Cited

U.S. PATENT DOCUMENTS

6,043,608 A * 3/2000 Samukawa et al. ...... 315/111.51
7,084,832 B2 * 8/2006 Pribyl .......................... 343/866
(Continued)

*Primary Examiner* — Nikita Wells
(74) *Attorney, Agent, or Firm* — Sutherland Asbill & Brennan LLP (57) ABSTRACT

A plasma source apparatus for generating a beam of charged particles is disclosed. The apparatus comprises: a plasma chamber provided with an inlet for the ingress of gas and an aperture for the extraction of charged particles from the plasma chamber; a radio frequency (RF) plasma generation unit for generating a plasma inside the plasma chamber, the radio frequency plasma generation unit comprising first and second resonant circuits each tuned to resonate at substantially the same resonant frequency, the first resonant circuit comprising a first antenna and a first, RF power source adapted to drive the first resonant circuit at substantially its resonant frequency, and the second resonant circuit comprising a second antenna, whereby in use an RF signal is induced in the second antenna by the first resonant circuit due to resonant coupling, the second resonant circuit being configured to apply the induced RF signal to the plasma chamber to generate a plasma therein; and a particle accelerating unit for extracting charged particles from the plasma and accelerating the charged particles to form a beam, the particle accelerating unit comprising a second power source configured to apply potential between the plasma chamber and an accelerating electrode, the region between the plasma chamber and the accelerating electrode constituting an acceleration column. The second power source is adapted to output a high voltage relative to that output by the first, RF power source.

17 Claims, 2 Drawing Sheets

(51) Int. Cl.
*H01J 37/077* (2006.01)
*H01J 37/30* (2006.01)

(52) U.S. Cl.
CPC ...... *H01J 2237/063* (2013.01); *H01J 2237/083* (2013.01); *H01J 2237/31* (2013.01)

(56) References Cited

U.S. PATENT DOCUMENTS

| | | | |
|---|---|---|---|
| 2003/0150710 A1* | 8/2003 | Evans et al. | 204/164 |
| 2005/0098117 A1* | 5/2005 | DiVergilio et al. | 118/723 E |
| 2006/0254520 A1* | 11/2006 | Rostoker | 118/723.001 |

* cited by examiner

PLASMA SOURCE APPARATUS AND METHODS FOR GENERATING CHARGED PARTICLE BEAMS

This non-provisional application claims the benefit of International Application No. PCT/GB2013/051296, filed May 20, 2013, which in turn claims the benefit of Great Britain Patent Application No. 1210607.6 No. 61/655,135, filed Jun. 4, 2012. The prior applications are hereby incorporated by reference in their entirety.

This invention relates to plasma source apparatus for generating beams of charged particles such as electrons or ions, and methods of such generation. Uses of the charged particle beams include materials processing applications such as welding, additive layer manufacturing, and drilling, cutting, curing, melting, evaporation or other treatments whereby a material or workpiece is modified or treated using the beam.

Most electron guns employed as welding equipment and for similar processing tools use a thermionic emitter as their source of electrons. For this type of emitter a refractory metal is heated to a temperature where the electrons can escape the surface and then be accelerated by an applied electric field. There are a number of inherent problems with this design. For example, the cathode dimensions are very critical, and as it runs hot it distorts and evaporates such that these dimensions change. Also the cathode lifetime can be short (e.g. 6 hours weld time on industrially applied equipment) and maintenance costs can be high. In addition, during the lifetime of the cathode the beam quality can vary, changing welding performance and hence requiring re-adjustment of welding parameters. Further, cathode lifetime is shortened if the gun vacuum is compromised and cathode wear can be accelerated by ion bombardment—these ions originating from the weld pool and residual gas in the vacuum enclosure. Another variant of thermionic emitters is back bombardment devices, in which the hot cathode is arranged to emit electrons onto a target from which the main charged particle beam is emitted. An example of such a device is given in WO-A-94/13006.

Alternatives to thermionic emitters include photocathodes, cold emission or plasma sources. In the case of plasma sources, a gas such as helium, argon or air is ionised to form a plasma and charged particles (electrons or ions) are extracted from the plasma and accelerated to form a beam. Since the particles are sourced from an ionised gas, there is no hot metal cathode and hence the operation and maintenance of the source is straightforward compared with thermionic emitters. In addition, plasma sources are relatively insensitive to gases and vapours which may enter the apparatus during use. However, the adoption of plasma sources has not been widespread due to difficulties including a slow response time of the source placing limits on the minimum beam pulse durations that are achievable, and complex power source requirements.

For example, Tomsk State University of Control Systems and Radioelectronics (TUSUR) have designed and made plasma cathode electron guns which operate at up to 60 kV accelerating potential and 12 kW power. Some examples are described in "Electron-beam facilities based on plasma-cathode guns" by N. Rempe et al, Welding and Cutting 11 (2012) No. 2, page 122. The plasma is generated by a DC excitation applied for example using a hollow-cathode low-voltage reflected discharge technique in which a potential is established between each of two cathodes and an intervening anode within the plasma chamber. In order that the charged particles can be accelerated out of the plasma with sufficient energy, the low voltage applied discharge must be floated at a high voltage suitable for acceleration (e.g. −60 kV). As such, a bespoke high voltage power supply must be used to provide the plasma excitation and the acceleration voltage. This is complex, expensive and also bulky due to the large dimensions of components suitable for handling and manipulating high voltages.

Another drawback of such plasma cathode electron guns is that the DC plasma excitation power supply is not readily engineered to have a rapid slew rate since the capacitance of the cable and plasma chamber must be charged and discharged. This leads to a minimum time for each beam pulse and also for changes to the beam power, which is typically at least 35 microseconds. This is undesirable since many materials processing applications require greater control over the particle beam. One approach for countering this problem is to add a grid electrode in front of the plasma source (a "triode gun" arrangement). The grid electrode controls the electric field strength at the surface of the plasma, thereby controlling electron emission, and its potential can be controlled and adjusted relatively quickly. This can be used to achieve a pulsed beam output whilst the plasma itself is generated continuously. However, grid electrodes generally degrade the beam quality as they have aberrant electron optical qualities. In addition, the use of grid electrodes complicates the gun structure, power supplies and control system.

Another example of a plasma source is disclosed in 'High current, low pressure plasma cathode electron gun' by Goebel and Watkins (Review of Scientific Instruments, 71, 388-398 (2000)). Here, a plasma is generated by thermionic emission of electrons from a hot filament inside a static gas at very low pressure. However this too suffers from similar problems with a minimum time required in order to bring the filament to the required voltage to strike a plasma discharge, as well as complex power supply circuitry. In addition, the use of a hot filament brings with it the disadvantages of standard thermionic emitters described above.

In accordance with the present invention, a plasma source apparatus for generating a beam of charged particles is provided, the apparatus comprising:

a plasma chamber provided with an inlet for the ingress of gas and an aperture for the extraction of charged particles from the plasma chamber;

a radio frequency (RF) plasma generation unit for generating a plasma inside the plasma chamber, the radio frequency plasma generation unit comprising first and second resonant circuits each tuned to resonate at substantially the same resonant frequency, the first resonant circuit comprising a first antenna and a first, RF power source adapted to drive the first resonant circuit at substantially its resonant frequency, and the second resonant circuit comprising a second antenna, whereby in use an RF signal is induced in the second antenna by the first resonant circuit due to resonant coupling, the second resonant circuit being configured to apply the induced RF signal to the plasma chamber to generate a plasma therein; and a particle accelerating unit for extracting charged particles from the plasma and accelerating the charged particles to form a beam, the particle accelerating unit comprising a second power source configured to apply potential between the plasma chamber and an accelerating electrode, the region between the plasma chamber and the accelerating electrode constituting an acceleration column;

wherein the second power source is adapted to output a high voltage relative to that output by the first, RF power source.

The invention further provides a method of generating a beam of charged particles, comprising:

admitting gas to a plasma chamber, the plasma chamber having an inlet for the ingress of gas and an aperture for the extraction of charged particles from the plasma chamber;

generating a plasma inside the plasma chamber using a radio frequency (RF) plasma generation unit comprising first and second resonant circuits each tuned to resonate at substantially the same resonant frequency, the first and second resonant circuits comprising first and second antennas, respectively, by using a first, RF power source to drive the first resonant circuit at substantially its resonant frequency such that an RF signal is induced in the second antenna by the first resonant circuit due to resonant coupling, the second resonant circuit applying the induced RF signal to the plasma chamber to generate a plasma therein; and extracting charged particles from the plasma and accelerating the charged particles to form a beam by using a second power source to apply potential between the plasma chamber and an accelerating electrode, the region between the plasma chamber and the accelerating electrode constituting an acceleration column;

wherein the voltage output by the second power source is high relative to that output by the first, RF power source.

By generating a plasma using RF excitation, the plasma parameters can be changed (including ignition and extinction of the plasma) very quickly compared with DC plasmas. This is because the amount of energy stored in the circuit is inherently lower and because RF signals can be readily modulated by an appropriate controller in a well known manner. As such, the plasma can be switched on and off very rapidly, e.g. in less than 1 microsecond. Beam pulsing at such timescales has been found to be very beneficial in controlling heat input during welding, machining and other processes. Such short response times also benefit other process control steps such as changes in beam power (e.g. via modulating the RF amplitude) which may be used for example during a raster used to generate an electron image of a workpiece (described further below). Since the plasma itself can be controlled at such short timescales, the need for a grid electrode is eliminated such that the source can be implemented as a diode gun arrangement, thereby achieving high integrity particle beams.

The disclosed apparatus and methods additionally eliminate the previous need for a bespoke high voltage power source, the complexity of which would be further increased if it were required to supply high voltage RF (rather than DC). Instead, the RF excitation is driven by a relatively low voltage (first) power source which is inductively coupled to the plasma chamber though the use of the first and second resonant circuits. This first RF power source can therefore be an off-the-shelf, conventional RF supply such as a commercially available low power (e.g. 50 W) RF generator. Such components are relatively inexpensive and physically compact. The high voltage required to accelerate the particles, meanwhile, is provided by a separate, second power source which applies a potential between the plasma chamber and an accelerating electrode. Since only a single (typically DC) high voltage output is required, this too can be achieved by a conventional, readily available high voltage power source. The high voltage is isolated from the low voltage first power source due to the inductive nature of the coupling between the first and second resonant circuits. Hence, the first resonant circuit can operate at close to ground potential.

Overall, the disclosed arrangement makes it possible to utilise two conventional power sources, thereby reducing the cost and complexity relative to previous designs requiring specialist, bespoke supplies.

It should be noted that references to the voltages output by the first and second power sources being "high" or "low" refer to the absolute magnitudes of the voltages and not their signs (+/−).

A further benefit of the disclosed apparatus and methods is that the physical connections between the two power sources and the device housing the plasma chamber and acceleration column can be formed of more flexible cables than in other particle beam sources. This improves the manoeuvrability of the beam gun which is particularly important for in-chamber guns and sliding seal guns. The improved flexibility arises due to elimination of the need for multi-cored HV cables as are required in cases where more than one HV line is output from one HV power source. In the disclosed apparatus, a single core (and therefore highly flexible) cable can be used to place the potential supplied by the second (HV) power source across the acceleration column and a separate single RF coaxial cable can be used to generate the plasma from the first (low voltage) power source. As such no large-diameter, unwieldy multicore HV cables are required.

As mentioned above, the inductive coupling between the first and second resonant circuits isolates the first power source from the high acceleration voltage. The electrical isolation between the two circuits can be achieved in a number of ways, however in preferred examples, isolation is achieved at least in part by making use of the gun vacuum (the acceleration column will be evacuated in use in order to permit the formation of a charged particle beam, as in conventional devices). In one preferred embodiment, at least the plasma chamber, acceleration column and the second antenna are disposed within a housing, the apparatus further comprising a pump for evacuating the housing such that the second antenna is substantially electrically insulated from the first antennas in use. The first antenna could be disposed outside the housing and couple power to the second antenna remotely. The housing in this case would be non-conductive and may itself contribute to the electrical isolation.

However in a particularly preferred embodiment, at least the plasma chamber, acceleration column and first and second antennas are disposed within a housing, the apparatus further comprising a pump for evacuating the housing such that the first and second antennas are substantially electrically insulated from one another in use. In this way, the first and second antennas essentially form primary and secondary coils of a vacuum-cored transformer (which may or may not have any gain). By placing both antennas within the housing a particularly compact arrangement is achieved and the antennas can be disposed in fixed relation to one another, thereby optimising power transfer. Preferably, one antenna is disposed inside the other, both antennas sharing a common longitudinal axis.

The use of the gun vacuum to isolate the antennas is advantageous since there will be no damage to the insulator (vacuum) in case of breakdown, and given that the provision of a vacuum is necessary for the acceleration column, using it also to provide electrical insulation avoids the need for any additional components. However, in alternative implementations, an electrical insulating material, preferably a ceramic or polymer, is provided between the first and second antennas to insulate the antennas from one another. For example, an epoxy resin or an oil could be used.

The first, RF power source is advantageously a low voltage source and is preferably adapted to output a signal with a power amplitude of up to 300 W, more preferably up to 100 W, still preferably up to 50 W. Thus, a commercially available RF generator can be used with a standard coaxial cable connector. In particularly preferred embodiments, one end of the first antenna in the first resonant circuit is at ground potential. For example, one end of the antenna may be physically attached to ground at the gun column wall. However, grounding the antenna is not essential.

Preferably the apparatus further comprises a controller for modulating the RF signal output by the first power source. This can be used to switch the plasma on and off through appropriate modulation of the RF, with a fast response time, or to change the power of the beam for example, through modulation of the RF amplitude. In a preferred example, the controller is further adapted to control the amplitude of the RF signal between a first amplitude at which the power of the generated beam is suitable for materials processing, and a second amplitude at which the power of the generated beam is suitable for imaging a workpiece, the first amplitude being greater than the second amplitude.

Advantageously, the second power source is adapted to output a DC signal, preferably having a voltage magnitude in the range 10 kV to 200 kV, more preferably 25 kV to 175 kV, still preferably 60 kV to 150 kV. The output voltage will determine the acceleration of the charged particles out of the plasma chamber and hence its magnitude will be selected according to the beam energy desired for any particular application. Where the charged particles to be extracted are electrons, typically the second power source will be arranged to apply a negative high voltage (e.g. −60 kV) to the plasma chamber and the accelerating electrode will be grounded, thereby presenting a positive electric gradient from the plasma chamber to the accelerating electrode, in order to accelerate electrons from the plasma.

The second power source may advantageously be a pulsed power source, preferably adapted to output pulses of power with a duration of 10 microseconds or less. Each pulse of power gives rise to a brief accelerating potential and hence a pulse of charged particle beam. This manner of control may be utilised as an alternative or in addition to modulation of the RF supply.

Preferably, the voltage of the second power source is greater (in terms of magnitude) than that of the first, RF power source by at least a factor of 100, more preferably at least a factor of 1000. The second power source is preferably a DC power source.

Advantageously, each of the first and second resonant circuits comprise series or parallel LC or RLC circuits (L=inductance, C=capacitance, R=resistance), the first and second antenna forming inductors of the first and second resonant circuits respectively. In a particularly preferred embodiment, the second resonant circuit comprises a capacitor coupled directly across the second antenna.

The first and/or second antenna could take any appropriate form including multi-turn coils, square or other-shaped loops, or linear elements as necessary in order to achieve the desired inductance values. However in preferred implementations, the first and/or second antenna comprises a single turn. For example, the second antenna may comprise a copper or aluminium annulus with a radial gap across which a capacitor may be coupled to form an LC combination.

The inductive coupling between the first and second resonant circuits may not result in any stepping (up or down) of the induced voltage (or current) relative to that output by the first power source. However, depending on how the plasma chamber is coupled to the second resonant circuit it may be desirable to adjust the signal parameters accordingly. For example, if the circuit is arranged to apply the induced signal directly to the plasma chamber, a higher voltage is desirable and hence it is preferred that the second resonant circuit has a sufficiently high quality (Q) factor such that the voltage of the induced RF signal is higher than the voltage output by the first, RF power source. For example, the amplitude of the voltage of the induced RF signal may be between 1 kV and 10 kV, preferably between 1 kV and 5 kV. However if the circuit is configured to induce a plasma within the chamber (e.g. through the provision of a coil surrounding the chamber), a high current is required, in which case the circuit components would be chosen to provide a high secondary current. In preferred embodiments, the Q factor of the second resonant circuit is at least 500, more preferably at least 750. This can be configured through circuit design and selection of appropriate L, C (and R) values for the circuit. The first resonant circuit will preferably be impedance matched to the first RF power source at the resonant frequency in accordance with standard techniques, which will inherently result in a high Q factor for the first circuit.

The first and second resonant circuits could be configured to resonate at any frequency corresponding to that of the first RF power source, through appropriate choice of components. However in preferred embodiments, the inductance and capacitance of the first and second resonant circuits are selected such that each resonant circuit has a resonant frequency in the range 1 MHz to 160 MHz, preferably 27 MHz to 100 MHz, most preferably around 84 MHz.

As already mentioned, the induced RF signal can be coupled to the plasma chamber in a number of ways. In one preferred embodiment, the second resonant circuit is configured to apply the induced RF signal across the plasma chamber between electrodes in contact with the interior of the chamber, the electrode preferably being formed by electrically conductive portions of the walls defining the plasma chamber, separated by an insulating portion thereof. In a particularly preferred implementation, the plasma chamber is defined by a side wall formed of an insulating material, an upper wall formed of a conductive material and defining the inlet for gas ingress therein, and a diaphragm formed of a conductive material and defining the aperture for extracting charged particles therein, the second resonant circuit being adapted to apply the induced RF signal between the upper wall and the diaphragm. The plasma chamber therefore forms an integral part of the second resonant circuit and preferably the insulating material comprises a dielectric (e.g. boron nitride or alumina ceramic) such that the plasma chamber contributes to the capacitance of the second resonant circuit. In this case the capacitance of the chamber itself will need to be taken into account when tuning the circuit. When a plasma is ignited within the chamber, the loading of the secondary circuit will increase and this will lower the circuit's Q factor, lowering the plasma voltage but making more current available for sustaining the plasma.

In an alternative implementation, the second resonant circuit may be configured to apply the induced RF signal across the plasma chamber via an inductive coil disposed around the plasma chamber. In such cases, the chamber walls are preferably non-conducting or at least have a break in any conducting skin in order to avoid inducement of eddy current which would otherwise cancel out the magnetic field of the inductive coil.

Preferably, the particle accelerating unit is adapted to apply the accelerating voltage between a diaphragm formed of a conductive material in which the aperture for extracting charged particles is defined, and the accelerating electrode, thereby constituting a diode accelerator. As described above, this configuration gives rise to a high integrity beam. However if additional control of the beam is required, the apparatus may further comprise a grid electrode located in the acceleration column between the diaphragm and the acceleration electrode, and a module for applying a grid voltage to the grid electrode for adjusting the beam of particles, thereby constituting a triode accelerator.

As already indicated, the apparatus could be used to form beams of any type of charged particle, including (positive) ions. However, preferably, the charged particles extracted from the plasma are electrons and the accelerating electrode is an anode, preferably at or around ground potential.

Advantageously, the apparatus further comprises a magnetic trapping assembly for confining the plasma within the plasma chamber. This enhances the plasma by increasing the number of collisions between particles and thereby improves the intensity of the generated beam. In preferred examples, the magnetic trapping assembly comprises one or more permanent magnets or electro-magnets disposed around the radial periphery of the plasma chamber configured to give rise to an axial magnetic field within the plasma chamber. For example, the magnet(s) may be configured to form a Penning trap. The use of an electromagnetic arrangement provides an additional benefit since the power supply to the electromagnet (i.e. a conventional, third power supply) can be switched on and off readily, thereby providing an additional way to control the plasma. For instance, the electromagnet could be used to achieve emission of short beam pulses through control of the plasma intensity. Preferably, the magnetic field has a magnetic field strength of around 0.01 to 0.1 Tesla.

Another factor that can affect the shortest beam pulse duration is plasma lifetime. In air at atmospheric pressure, a plasma will only exist for a very short period (e.g. 20 ns) since the ionised particles will quickly recombine with ambient gas molecules. However, in a vacuum (or very low pressure environment), such as that encountered within the plasma chamber, the plasma lifetime will increase to several milliseconds. This results in a delay between turning off the RF supply (or decreasing the plasma intensity) and the actual extinction of the plasma (and hence the emitted beam), imposing a limit on the minimum pulse duration that is achievable. Preferably, the walls of the plasma chamber are utilised to keep the plasma lifetime to a minimum by ensuring that ions of the plasma will strike the chamber walls often, hence losing their charge rapidly and leading to plasma extinction if excitation has been stopped. This is achieved by arranging for the chamber diameter (i.e. its average lateral dimension; it is not essential for the chamber to be circular) to be less than the average path length of the ions.

The ion path length will depend on the type of gas (since a heavier gas species will have greater momentum and therefore will tend to travel along a straighter trajectory, despite the Lorentz force imposed by the magnetic field, as compared with lighter gases) as well as on the magnitude of the magnetic field (which will affect the Lorentz force). For example, where the gas used is helium and the magnetic field has a strength of around 0.01 to 0.1 T, a plasma chamber diameter of around 2 to 3 mm has been found to assist in reducing the plasma lifetime. More generally, it is preferred that the plasma chamber has a diameter of 12 mm or less, preferably between 1 and 5 mm, more preferably between 2 and 3 mm. Such dimensions will also provide the same benefits where heavier gases are uses and/or the magnetic field strength is weakened, since both will tend to increase the path length of the ions. If on the other hand the path length is decreased, then a smaller chamber size may be appropriate.

Preferably, the gas type, dimensions of the plasma chamber and, if applied, the magnetic field strength are selected in combination such that the plasma lifetime within the chamber, once RF excitation is stopped, is less than 10 microseconds, still preferably less than 1 microsecond.

The aperture for extracting charged particles is preferably defined in a diaphragm comprising a ferromagnetic material, preferably steel or soft iron. This enables any magnetic field established in the plasma chamber to be screened from the acceleration column which would otherwise affect the beam shape.

The size of the aperture is significant since it is important that substantially no gas or plasma reaches the acceleration column since this could lead to a discharge between the plasma chamber and acceleration electrode. Appropriate aperture sizes will depend on the gas in use and the plasma parameters but in preferred examples, the aperture for extracting charged particles has a diameter of 2 mm or less, preferably between 0.1 and 1 mm, most preferably around 0.5 mm.

The gas ingress to the plasma chamber can be achieved using any appropriate gas flow system but in preferred implementations, the inlet for the ingress of gas comprises a valve for controlling the ingress of gas to the plasma chamber, preferably a needle valve. This arrangement allows for a steady low flow of gas to be admitted to the plasma chamber. During use, particles will leak from the plasma chamber through the aperture and, additionally, charged particles may be at the same time extracted from the chamber. Quantity flow rates through the inlet and the aperture are therefore preferably arranged such that the chamber pressure remains substantially constant. In an alternative implementation, gas could be supplied to the plasma chamber from a local gas reservoir that is replaced periodically. The gas flow from this would preferably be controlled with a valve, such as a needle valve or similar. The reservoir could be a compressed gas cylinder or a gas-impregnated material for example.

Plasma sources in accordance with the present invention are particularly well adapted for use in materials processing applications where a workpiece or a material (including gaseous material) is modified by application of the charged particle beam. Hence, the present invention further provides a materials processing tool comprising a plasma source as described above.

In particular examples, the tool is:
- an electron beam welding tool, the beam of charged particles being adapted for the welding of materials;
- an additive layer manufacturing tool, the beam of charged particles being adapted for treatment of a powder material, preferably the fusion thereof;
- a drilling tool, the beam of charged particles being adapted for drilling a workpiece;
- a curing tool, the beam of charged particles being adapted for curing of a workpiece;
- a cutting tool, the beam of charged particles being adapted for cutting of materials;
- a melting or evaporation tool, the beam of charged particles being adapted for melting and/or evaporation of materials;
- a gas treatment tool, the beam of charged particles being adapted for the treatment of gaseous substances, preferably combustion fumes; or
- a sterilisation tool, the beam of charged particles being adapted for sterilisation of solids or liquids.

The invention further provides corresponding methods of generating a charged particle beam, incorporating any of the features discussed above. The methods may analogously be used in materials processing methods and as such the invention also provides a method of modifying a workpiece using a beam of charged particles generated in accordance the above described methods. The beam of charged particles may be used (inter alia):

- to weld a workpiece;
- to fuse a workpiece, wherein the workpiece comprises a powder material;
- to drill a workpiece;
- to cure a workpiece;
- to cut a workpiece;
- to melt and/or evaporate a workpiece;
- to treat a gaseous workpiece, preferably combustion fumes; or
- to sterilise a solid or liquid.

In another example, the ability to readily change the beam parameters can be utilised to enable imaging of a workpiece during a modification or treatment process. Preferably, a method of imaging a workpiece during a process of modifying the workpiece using a beam of charged particles generated as described above, comprises, in either order:

- using the beam of charged particles to modify the workpiece; and
- using the beam of charged particles to image the workpiece wherein, between the two steps, the amplitude of the RF signal is modulated from a first amplitude, at which the generated beam power is suitable for modifying the workpiece, to a second amplitude, at which the generated beam power is suitable for imaging the workpiece, or vice versa, the first amplitude being greater than the second amplitude.

Examples of plasma source apparatus and methods for generating a beam of charged particles will now be described with reference to the accompanying drawings, in which.

The description below will largely focus on examples of charged particle beam generating apparatus and methods wherein the charged particles forming the beam are electrons and hence the device may be referred to generally as an electron gun. However it will be appreciated that the disclosed apparatus and methods could readily be adapted to generate beams of positive ions by reversing the polarisation of the acceleration column.

Figure 1:
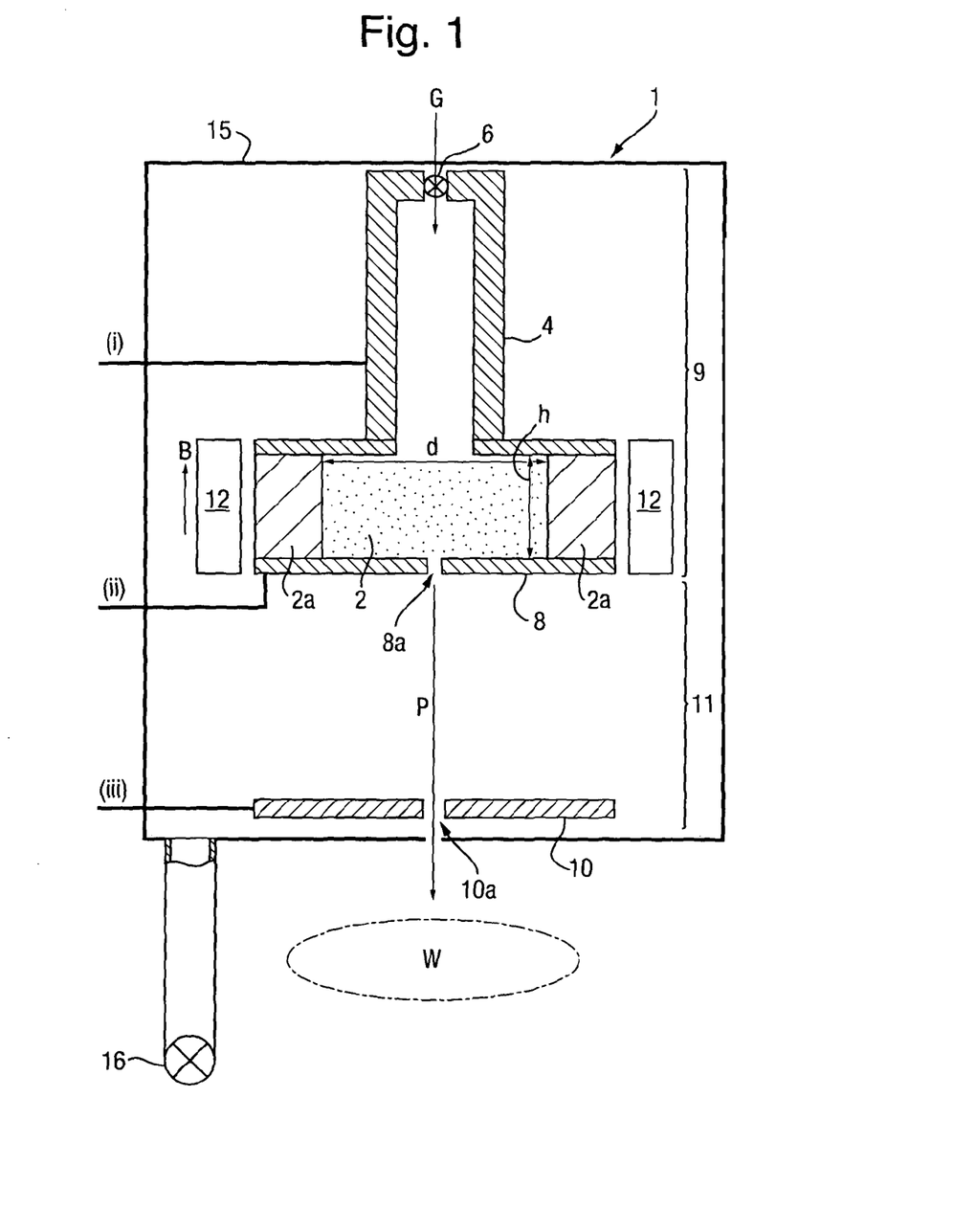
FIG. 1 schematically shows selected components of a charged particle beam generating apparatus in accordance with a first embodiment.

FIG. 1 shows an electron gun column 1 forming part of an apparatus for generating charged particle beams in a first embodiment of the invention. The gun column includes a source region 9 in which charged particles are generated and an accelerating column 11 in which charged particles extracted from source region 9 are formed into a beam. In use the charged particle beam P may be directed onto a workpiece W, in order to weld, fuse or otherwise modify the material for example.

The source region 9 comprises a plasma chamber 2, into which gas G is allowed to enter via inlet 6, which here comprises a needle valve disposed in a hollow electrode 4. The hollow electrode 4 defines one side of the plasma chamber 2, and the opposite side is defined by a diaphragm 8 having at least one aperture 8a through which charged particles may be extracted from the plasma chamber 2. In this example, the hollow electrode 4 and diaphragm 8 are formed of conductive materials (typically metals) which are spaced from one another by an insulating material 2a such as boron nitride or alumina forming the side walls of the plasma chamber. The hollow electrode 4, insulator 2a and diaphragm 8 form what is generally referred to as a "hollow cathode" (assuming that the source is adapted to emit electrons rather than positive ions).

As will be described in more detail below, to generate a plasma within chamber 2, a low pressure of gas (e.g. Helium, Argon or air) is admitted to the chamber via inlet 6. Typically a moderate pressure of gas is fed to the gun (e.g. 1 bar) and the needle valve or other control device restricts the flow such that an appropriate low pressure is established within the chamber (e.g. 1 mbar). The gas pressure in the plasma chamber 2 is stable since gas leaks from the plasma chamber through the aperture 8a into the acceleration column at substantially the same quantity flow rate as that through the needle valve. A radio frequency (RF) power signal is applied to the chamber on lines (i) and (ii), i.e. between the hollow electrode 4 and the diaphragm 8. The RF signal excites and ionises the gas within the chamber 2 resulting in a plasma of ions and electrons.

In the acceleration column 11, a high accelerating voltage is applied between the diaphragm 8 and an accelerating electrode 10, spaced from the plasma chamber, on lines (ii) and (iii) respectively. To form an electron beam, the accelerating electrode is placed at a strong positive potential relative to the diaphragm 8. Electrons are extracted from the plasma through aperture 8a, are accelerated towards the accelerating electrode 10 and pass through aperture 10a therein to form a beam P. Additional beam shaping equipment such as magnetic lensing arrangements and/or shaped electrodes may be provided in a known manner between the plasma chamber and the accelerating electrode and/or between the accelerating electrode and the workpiece region to adjust the shape of the generated beam.

The plasma chamber 2 and acceleration column are disposed within a housing 15 which in use is evacuated by a pump 16 (e.g. a turbomolecular pump) to a low pressure typically less than $5 \times 10^{-4}$ mbar, in order that the beam of charged particles is not disrupted by atmospheric gases.

Optionally but preferably, an annular magnet 12 is disposed around the plasma chamber 2 which acts to magnetically confine the plasma within the chamber. For example, the magnet 12 may be configured as a Penning trap, whereby an axial magnetic field is established within the plasma chamber (represented by arrow B). The axial field gives rise to a Lorentz force on the moving charged particles, causing them to follow curved trajectories and hence confining the particles within the chamber. This also results in an increase in the number of collisions between particles, thereby enhancing its intensity. The magnet 12 could be a permanent magnet or an electromagnet.

Figure 2:
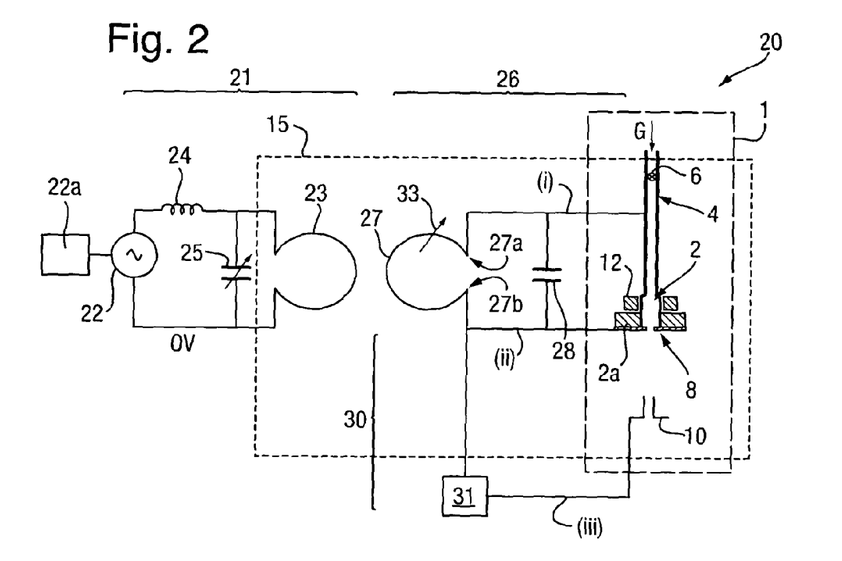
FIG. 2 is a circuit diagram illustrating a second embodiment of a charged particle beam apparatus.

FIG. 2 shows a schematic circuit diagram for a charged particle beam apparatus according to a second embodiment. This includes an electron gun column 1 which is functionally identical to that described with respect to FIG. 1 and hence like reference numerals are used to identify like components, which will not be described again. In this case, the magnet 12 is positioned immediately above the material forming the plasma chamber walls rather than directly about its circumference.

Power is supplied to the plasma chamber by a plasma generating unit comprising circuits 21 and 26. The circuits 21 and 26 are resonant circuits, in this case configured as parallel LC circuits, tuned to resonate at substantially the same resonant frequency as one another by appropriate selection of their inductance and capacitance values.

The first resonant circuit 21 comprises a RF power source 22, the output of which is placed across a first antenna 23. A (preferably variable) capacitor is placed in parallel across the first antenna which provides inductance, to thereby form an LC resonator. The circuit is tuned through selection of the inductance and capacitance values to resonate substantially at the frequency of the signal output by the source 22. Optionally but preferably, a matching inductor 24 may be provided to assist in matching the impedance of the antenna 23 to that of the power source 22. In a preferred example, the power source outputs a signal at approximately 84 MHz and the first circuit 21 is tuned to resonate at that frequency although in other cases a source of different frequency (e.g. 27 MHz, 49 MHz) may be utilised instead, with the circuit tuned as appropriate. In one preferred example, the inductance of matching inductor 24 may be around 600 nH, that of the antenna 23 around 235 nH and the capacitance of capacitor 25 around 15 pF. However, other sets of values could be used for the components to achieve the desired tuning.

The first power source 22 preferably operates close to ground potential and in most preferred embodiments, one end of the antenna 23 is grounded, e.g. by physical attachment to the gun casing. The magnitude of the voltage output by the first power source is preferably in the range +/− 15 V up to +/− 3 kV, depending on the circuit implementation. The power source 22 drives the first circuit causing the antenna 23 to resonate.

The second resonant circuit 26 also comprises an arrangement of inductors and capacitors including second antenna 27 and capacitor 28 in parallel. With the circuit 26 coupled to the plasma chamber in the manner described above, the plasma chamber itself acts as a capacitor within the circuit and contributes to the capacitance. The values of inductance and capacitance are tuned such that the circuit resonates at the same frequency as that as the first circuit, such that the two circuits are inductively coupled. For example, to resonate at approximately 84 MHz, the total capacitance in the second circuit 26 may be approximately 72 pF and the secondary inductance may be approximately 50 nH. Alternatively, the capacitance could be around 144 pF and the inductance around 25 nH. In preferred examples, the fixed capacitance 28 may be around 40 pF and the remaining capacitance will be provided by the plasma cavity, together with any stray capacitance. In preferred examples, an element 33 is provided (of which an exemplary implementation is given below), via which the inductance of the second antenna 27 can be modified in order to tune the resonant frequency of the second circuit 26. The first circuit thereby induces a RF signal in the second antenna 27. The second circuit applies the induced signal between the hollow cathode 4 via line (i) and the diaphragm 8 via line (ii), to generate a plasma in the plasma chamber.

In order to transmit power between the first and second circuits efficiently, the second resonant circuit 26 preferably has a quality factor ("Q factor") of at least 500, again determined through selection of appropriate inductance and capacitance values. Preferably the Q factor is sufficiently high such that the voltage of the induced RF signal in antenna 27 is stepped up relative to that output by the first RF power source 22. Preferably a high voltage of up to 3 kV is thereby generated across capacitor 28.

Acceleration of particles to form a beam is achieved by acceleration circuit 30. This includes a second power source 31 which outputs a high, typically DC, voltage so as to apply a large potential between the plasma chamber and acceleration electrode 10. In this example a large negative potential (e.g. −60 kV) is applied to the diaphragm 8 and the accelerating electrode is grounded. In other cases the high voltage may be applied to an additional electrode provided adjacent the diaphragm 8 (described below). Electrons are thus extracted from the plasma and accelerated towards the accelerating electrode to form a beam of high energy.

The arrangement shown is a diode gun arrangement, utilising only two electrodes for beam acceleration (the diaphragm 8 and the accelerating electrode 10). This is preferred since a high integrity beam can be achieved. However, if additional control over the beam shape is desired, a grid electrode (not shown) may be inserted adjacent the diaphragm in the acceleration column.

The inductive nature of the coupling between the two resonant circuits isolates the first circuit 21 and the first power supply 22 from the high acceleration voltage supplied by source 31. To ensure electrical isolation between the two antennas, in preferred examples both antenna are located within housing 15 which in use is evacuated as described above. The vacuum insulates the antennas 23 and 27 from one another. In alternative embodiments, the first antennas may be located outside the housing. In other cases, insulating materials such as oil, epoxy, ceramics or similar may be utilised in addition or as an alternative to vacuum isolation.

By supplying the RF generation signal through inductive coupling in this way, a conventional low voltage RF generator can be used as source 22. Likewise a separate, conventional high voltage DC source 31 can be used to provide the high acceleration voltage required to form the beam. This enables the power supply to be formed by two conventional, off the shelf power sources and in addition removes any need for multi-cored high voltage cables since only one high voltage supply (source 31) is required. The electron gun can therefore be connected to the power sources by flexible cables and remains highly manoeuvrable.

By generating a plasma using RF in the manner described above, the electron gun has a very fast response time as compared with DC plasmas and thermionic sources. The plasma can be controlled through modulation of the RF supply for example, enabling response times of 1 microsecond or less. This leads to the availability of corresponding short beam pulse times, which are highly beneficial in many practical applications owing to the increased beam control. Rapid pulsing of this sort can also be used to change the beam's effective power level: for example, a beam pulsed at a 50% duty cycle will impart only half the power (and heat) to a workpiece as compared with a continuous beam of the same energy level (particle acceleration).

The beam parameters can also be varied by modulating the RF amplitude which will lead to a change in the number of charged particles available in the plasma, and hence the power of the extracted beam, with similarly short response times. This can be used for example to image a workpiece using an electron beam: in general, low power beams can be used to form an image of a workpiece's surface by rastering the beam over the surface and collecting the backscattered electrons in a manner similar to a low-resolution scanning electron microscope. However, high power beams suitable for example for welding cannot be used to form images since the rastering would melt the workpiece and in addition, high power beams lead to a lower resolution. Using the presently disclosed techniques, the power of the beam can be rapidly changed between different power levels by modulating the RF amplitude. For example, the power of a welding beam can be rapidly reduced such that the beam can be scanned across a workpiece's surface in the above-described manner to form an image without melting the workpiece, before restoring the high beam power to continue welding. Hence the apparatus could be used for example for process viewing or seam tracking during electron beam welding. In one example, the power level of the beam when used for welding may be around 5 kW whereas for imaging the power level may be reduced to around 150 W.

Control of the beam parameters for applications such as this may involve both pulsing (including control of the duty cycle) and amplitude modulation, if desired.

It has also been found that very low RF powers are required to generate an electron beam using the described apparatus. By way of comparison, in an apparatus according to FIG. 2, a 50 W RF power supply was utilised to generate a beam of 25 mA at 3 kV. This is less than 10% of the cathode heating power required for generating a comparable electron beam from a thermionic emitter. Similarly, plasma sources of the sort disclosed by Rempe et al typically require a source power of around 400 W.

The RF power supply 22 is preferably arranged to be modulated by a controller 22a using well known techniques. Modulating the RF can be used to change the RF supply to the plasma chamber, and hence the plasma, quickly such that short beam power transition times of the order of 1 microsecond can be achieved. Control of the beam can additionally or alternatively be achieved through control of the acceleration voltage via power source 31 and/or by adjustment of the magnetic containment field established by magnet 12 if this takes the form of an electromagnet. In one example the acceleration power source 31 could be a pulsed power source.

Preferably, the plasma chamber dimensions are selected to be less than the average path length of the ions in the plasma. This helps to ensure that the plasma lifetime is short since once RF excitation is stopped, the remaining ions will rapidly collide with chamber walls and lose their charge. The average path length of the ions depends inter alia on the gas species and the magnetic field strength. The larger the gas ion, the greater its mass and the less its trajectory will be curved by the magnetic field, leading to a longer average path length. A weaker magnetic field will also have the same result. For a magnetic field B of around 0.01 to 0.1 T, where the gas used is helium, a plasma chamber diameter d of up to 5 mm, preferably 2 to 3 mm has been found to give good results. The plasma chamber height h in this example is around 3 mm. Such dimensions can also be used where the gas species is heavier (e.g. argon) and/or the magnetic field strength is weaker. A smaller plasma chamber may be advantageous for lighter gases and/or stronger magnetic fields.

The dimensions of the aperture 8a are also of significance since whilst electrons (or ions) must be extracted through the aperture, it is undesirable for the plasma to escape through the aperture into the acceleration column since this could lead to a discharge between the plasma chamber and accelerating electrode. In preferred examples, the aperture 8a has a diameter of 1 mm or less. The diaphragm 8 is preferably formed of a ferromagnetic material such as iron or soft steel in order to shield the acceleration column from the magnetic field established within the plasma chamber, which could otherwise affect the beam shape.

Figure 3:
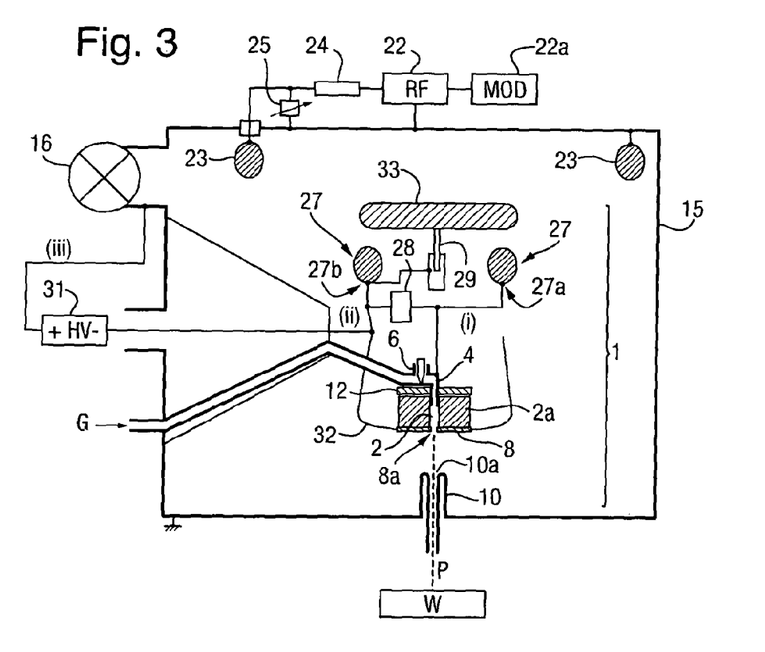
FIG. 3 is a schematic cross section through a charged particle beam generating apparatus in accordance with a third embodiment.

FIG. 3 shows a schematic cross-section of a charged particle beam apparatus according to a third embodiment.

The gun column 1 is located within a housing 15 which is evacuated in use by pump 16 in the manner described above. The housing is grounded so as to provide the accelerating electrode 10 detailed below. The first antenna 23 is additionally located within the housing, and is preferably formed of a single turn of metal. The second antenna 27 is preferably also formed of metal (e.g. aluminium or copper), and here takes the form of a single turn of conductor with a gap breaking the circle, located near the first antenna 23. The first antenna 23 is located near the second antenna 27 such that the two are arranged to be approximately concentric.

The element 33 is connected to one end 27b of antenna 27. In this example, element 33 comprises a disk mounted on a threaded member (or other assembly of adjustable height) 29, which allows the distance between the disk and the second antenna 27 to be adjusted thereby changing the inductance of the antenna 27, and assisting in the tuning of the circuit.

The other end 27a of antenna 27 is connected (via line (i)) to the hollow electrode 4 (which may for example take the form of a conductive block having a channel for the passage of the plasma gas G therethrough).

The capacitor 28 is placed across the two ends of antenna 27.

Finally, the first end 27b of antenna 27 is connected to a shaped electrode 32 which surrounds and abuts the diaphragm 8. The result is that the antenna 27 and capacitor 28 are connected in parallel across the plasma chamber 2 in the same manner as described with respect to FIG. 2.

As shown in FIG. 3, gas G is fed via needle valve 6 to the top of the hollow electrode 4 which routes the gas to plasma chamber 2, defined within insulating block 2a. An RF signal is induced in second antenna 27 by the first antenna 23 as described above and this is applied across the plasma chamber 2 between the hollow cathode block 4 and the diaphragm 8 to generate a plasma.

The second, high voltage power supply 31 is applied between electrode 32 and the accelerating electrode 10 formed by the grounded housing 15 to extract electrons from the plasma and generate a beam B. The shaped electrode 32 is configured in a known manner to achieve the desired beam shaping.

In one example, a 84 MHz RF power source near to ground potential was used as the first power source to drive the first resonant circuit and antenna 23, located inside the electron gun column. The second antenna 27, tuned to the same frequency, received the RF power and generated a voltage of up to 3 kV RF across the plasma chamber to excite a plasma in the gas. The gun envelope was held at a pressure of typically less than $5 \times 10^{-4}$ mbar and the gas pressure in the plasma chamber was maintained at around 1 mbar. A high acceleration voltage (e.g. +3 kV) was applied to the accelerating electrode by a second power source and an electron beam of 25 mA was achieved.

In alternative embodiments, the RF plasma could be generated via inductive techniques in which case the second resonant circuit would comprise a coil surrounding the plasma chamber in place of direct connections to the plasma chamber.

Plasma sources of the sorts described above are suitable for many applications and particularly in materials processing where the generated charged particle beam is used to modify a material or workpiece. Thus in preferred implementations the plasma source forms part of a materials processing tool such as electron beam welding equipment or additive layer manufacturing equipment. The beam of charged particles may be used to weld, cure, fuse, melt, evaporate, cut or otherwise treat a workpiece or material. Specific examples of applications include the fusing of powder materials in additive layer manufacturing, the extraction or refining of metals as well as the treatment of combustion fumes.

The invention claimed is:
1. A plasma source apparatus for generating a beam of charged particles, the apparatus comprising:

a plasma chamber provided with an inlet for the ingress of gas and an aperture for the extraction of charged particles from the plasma chamber;

a radio frequency (RF) plasma generation unit for generating a plasma inside the plasma chamber, the radio frequency plasma generation unit comprising first and second resonant circuits each tuned to resonate at substantially the same resonant frequency, the first resonant circuit comprising a first antenna and a first, RF power source adapted to drive the first resonant circuit at substantially its resonant frequency, and the second resonant circuit comprising a second antenna, whereby in use an RF signal is induced in the second antenna by the first resonant circuit due to resonant coupling, the second resonant circuit being configured to apply the induced RF signal to the plasma chamber to generate a plasma therein; and a particle accelerating unit for extracting charged particles from the plasma and accelerating the charged particles to form a beam, the particle accelerating unit comprising a second power source configured to apply potential between the plasma chamber and an accelerating electrode, the region between the plasma chamber and the accelerating electrode constituting an acceleration column;

wherein the second power source is adapted to output a high voltage relative to that output by the first, RF power source.

2. A plasma source apparatus according to claim 1, wherein at least the plasma chamber, acceleration column and the second antenna are disposed within a housing, the apparatus further comprising a pump for evacuating the housing such that the second antenna is substantially electrically insulated from the first antenna in use.

3. A plasma source apparatus according to claim 1, wherein the first, RF power source is adapted to output a signal with a power amplitude of up to 300 W, preferably up to 100 W, more preferably up to 50 W.

4. A plasma source apparatus according to claim 1, wherein the second power source is adapted to output a DC signal, preferably having a voltage magnitude in the range 10 kV to 200 kV, more preferably 25 kV to 175 kV, still preferably 60 kV to 150 kV.

5. A plasma source apparatus according to claim 1, wherein the second resonant circuit has a sufficiently high quality factor such that the voltage of the induced RF signal is higher than the voltage output by the first, RF power source.

6. A plasma source apparatus according to claim 1, wherein the second resonant circuit is configured to apply the induced RF signal across the plasma chamber between electrodes in contact with the interior of the chamber, the electrodes preferably being formed by electrically conductive portions of the walls defining the plasma chamber, separated by an insulating portion thereof.

7. A plasma source apparatus according to claim 1, further comprising a controller for modulating the RF signal output by the first power source.

8. A plasma source apparatus according to claim 7, wherein the controller is further adapted to control the amplitude of the RF signal between a first amplitude at which the power of the generated beam is suitable for materials processing, and a second amplitude at which the power of the generated beam is suitable for imaging a workpiece, the first amplitude being greater than the second amplitude.

9. A materials processing tool comprising a plasma source according to claim 1.

10. A materials processing tool according to claim 9, wherein the tool is one of:

an electron beam welding tool, the beam of charged particles being adapted for the welding of materials; an additive layer manufacturing tool, the beam of charged particles being adapted for treatment of a powder material, preferably the fusion thereof; a curing tool, the beam of charged particles being adapted for curing of a workpiece; a cutting tool, the beam of charged particles being adapted for cutting of materials; a melting or evaporation tool, the beam of charged particles being adapted for melting and/or evaporation of materials; a gas treatment tool, the beam of charged particles being adapted for the treatment of gaseous substances, preferably combustion fumes a sterilisation tool, the beam of changed particles being adapted for the sterilisation of solids or liquids; or a drilling tool, the beam of changed particles being adapted for the drilling of a workpiece.

11. A method of generating a beam of charged particles, comprising:

admitting gas to a plasma chamber, the plasma chamber having an inlet for the ingress of gas and an aperture for the extraction of charged particles from the plasma chamber;

generating a plasma inside the plasma chamber using a radio frequency (RF) plasma generation unit comprising first and second resonant circuits each tuned to resonate at substantially the same resonant frequency, the first and second resonant circuits comprising first and second antennas, respectively, by using a first, RF power source to drive the first resonant circuit at substantially its resonant frequency such that an RF signal is induced in the second antenna by the first resonant circuit due to resonant coupling, the second resonant circuit applying the induced RF signal to the plasma chamber to generate a plasma therein; and extracting charged particles from the plasma and accelerating the charged particles to form a beam by using a second power source to apply potential between the plasma chamber and an accelerating electrode, the region between the plasma chamber and the accelerating electrode constituting an acceleration column;

wherein the voltage output by the second power source is high relative to that output by the first, RF power source.

12. A method according to claim 11, wherein the first, RF power source outputs a signal with a power amplitude of up to 300 W, preferably up to 100 W, more preferably up to 50 W.

13. A method according to claim 11, wherein the second power source outputs a DC signal, preferably having a voltage in the range 10 kV to 200 kV, more preferably 25 kV to 175 kV, still preferably 60 kV to 150 kV.

14. A method according to claim 11, wherein the gas type, dimensions of the plasma chamber and, if applied, the magnetic field strength are selected in combination such that the plasma lifetime within the chamber, once RF excitation is stopped, is less than 10 microseconds, preferably less than 1 microsecond.

15. A method of modifying a workpiece using a beam of charged particles generated in accordance with claim 11.

16. A method according to claim 15, wherein the beam of charged particles is used to one of:

weld the workpiece;

fuse the workpiece, wherein the workpiece comprises a powder material cure the workpiece;

cut the workpiece;

melt and/or evaporate the workpiece;

treat a gaseous workpiece, preferably combustion fumes
sterilise a solid or liquid; or
drill the workpiece.

17. A method of imaging a workpiece during a process of modifying the workpiece using a beam of charged particles generated in accordance with claim 11, comprising, in either order:
using the beam of charged particles to modify the workpiece; and
using the beam of charged particles to image the workpiece
wherein, between the two steps, the amplitude of the RF signal is modulated from a first amplitude, at which the generated beam power is suitable for modifying the workpiece, to a second amplitude, at which the generated beam power is suitable for imaging the workpiece, or vice versa, the first amplitude being greater than the second amplitude.

* * * * *